United States Patent
Ohta

(10) Patent No.: US 9,054,287 B2
(45) Date of Patent: Jun. 9, 2015

(54) SUBSTRATE FOR MOUNTING LIGHT-EMITTING ELEMENT, PRODUCTION PROCESS THEREOF AND LIGHT-EMITTING DEVICE

(75) Inventor: Seigo Ohta, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 905 days.

(21) Appl. No.: 13/190,156

(22) Filed: Jul. 25, 2011

(65) Prior Publication Data

US 2012/0018759 A1 Jan. 26, 2012

(30) Foreign Application Priority Data

Jul. 26, 2010 (JP) ................. 2010-166968
Jun. 8, 2011 (JP) ................. 2011-128603
Jul. 14, 2011 (JP) ................. 2011-156025

(51) Int. Cl.
H01L 33/00 (2010.01)
H01L 33/60 (2010.01)
H01L 33/48 (2010.01)
H01L 33/64 (2010.01)

(52) U.S. Cl.
CPC ............ *H01L 33/60* (2013.01); *H01L 33/486* (2013.01); *H01L 33/641* (2013.01); *H01L 2224/48091* (2013.01); *H01L 2224/48227* (2013.01)

(58) Field of Classification Search
CPC ..................................... H01L 33/60
USPC .......................... 257/98, E33.072
See application file for complete search history.

(56) References Cited

U.S. PATENT DOCUMENTS

2005/0006794 A1 1/2005 Kashiwagi et al.
2009/0315057 A1 12/2009 Konishi et al.
2011/0140154 A1 6/2011 Nakayama et al.

FOREIGN PATENT DOCUMENTS

| EP | 2 387 083 A1 | 11/2011 |
| JP | 2004-168597 A | 6/2004 |
| JP | 2009-231440 | 10/2009 |
| JP | 2010-34487 | 2/2010 |
| WO | WO 2009/116457 A1 | 9/2009 |
| WO | WO 2010/021367 A1 | 2/2010 |
| WO | WO 2010/038451 A1 | 4/2010 |
| WO | WO 2010/150830 A1 | 12/2010 |

OTHER PUBLICATIONS

Extended European Search Report issued Mar. 12, 2012, in European Patent Application No. 11006130.6.

*Primary Examiner* — Hsin-Yi Hsieh
(74) *Attorney, Agent, or Firm* — Oblon, McClelland, Maier & Neustadt, L.L.P.

(57) ABSTRACT

To provide a substrate for mounting a light-emitting device, which is provided with a silver reflection layer having a high reflectance and being less susceptible to deterioration of the reflectance due to corrosion and which has an improved light extraction efficiency.

A substrate for mounting a light-emitting element 1, which comprises a substrate main body 2, a silver reflection layer 6 composed mainly of silver or a silver alloy, formed on the substrate main body 2, and a protective layer formed so as to cover the entire surface of the silver reflection layer 6, wherein the protective layer 7 contains an alumina filler and further contains a glass constituting the protective layer 7, having silver ions diffused therein. The concentration of silver ions contained in the glass of the protective layer 7 is at least 0.5 mass % and at most 5.0 mass %.

10 Claims, 4 Drawing Sheets (a)

(b)

(c)

(a)

(b)

(c)

(d)

SUBSTRATE FOR MOUNTING LIGHT-EMITTING ELEMENT, PRODUCTION PROCESS THEREOF AND LIGHT-EMITTING DEVICE

TECHNICAL FIELD

The present invention relates to a substrate for mounting a light-emitting element, a production process thereof and a light-emitting device, particularly to a substrate for mounting a light-emitting element which can prevent deterioration of light extraction efficiency, a process for producing the substrate for mounting a light-emitting element, and a light-emitting device employing the substrate for mounting a light-emitting element.

BACKGROUND ART

In recent years, along with a tendency to high brightness and whitening of a light-emitting element such as a light-emitting diode (LED), a light-emitting device employing a light-emitting element has been used for illumination, backlights of various displays or large-sized liquid crystal TVs, etc. The substrate for mounting a light-emitting element, to mount a light-emitting element, is usually required to have a high reflectivity to efficiently reflect light emitted from the element.

Accordingly, it has been heretofore attempted to provide a reflection layer (optical reflection layer) on the substrate surface for the purpose of reflecting light emitted from a light-emitting element to a forward direction as far as possible. Further, as such a reflection layer, a reflection layer composed mainly of silver (hereinafter, referred to as a silver reflection layer) having a high reflectance is employed.

However, silver is likely to be corroded, and if it is left to stand in an exposed state, oxidation or sulfurization tends to occur on the surface of the silver reflection layer, whereby reflectance (optical reflectance) tends to deteriorate. Accordingly, it has been proposed to cover the surface of the silver reflection layer with e.g. a silicone resin, an acrylic resin, an epoxy resin or a urethane resin so as to prevent deterioration of the reflectance. However, by such a method, moisture or a corrosive gas is likely to pass through the resin or enter from the interface between the silver reflection layer and the resin, whereby it was impossible to sufficiently prevent the deterioration of the reflectance due to corrosion (oxidation or sulfurization) of the silver reflection layer.

Accordingly, in recent years, in order to prevent corrosion of a silver reflection layer, a method has been proposed to coat the surface of a silver reflection layer with a protective layer made of a glass (see e.g. Patent Document 1). With the glass-made protective layer, the sealing property is excellent as compared with a resin-made protective layer, further the light transmittance is high, and the quantity of light arriving at the silver reflection layer increases, whereby it is possible to obtain a high reflectance. Further, a glass is excellent in the thermal conductivity, and therefore in a case where a glass layer is provided as a protective layer for the silver reflection layer, it is possible to obtain a heat dissipating property higher than a case where a resin layer is provided.

However, in such a case where a glass layer is provided as a protective layer, deformation due to e.g. swell tends to occur during firing since a glass usually has a high fluidity in a non-fired state, whereby the flatness of the surface of a glass layer deteriorates. Accordingly, in a case where a light-emitting element is mounted on the glass layer, the contact area between the light-emitting element and the glass layer becomes small, whereby the heat resistance increases. Further, if irregularities are formed on the mounting portion, the light-emitting element is likely to be fixed with an inclination and damaged by subsequent wire bonding, and further an optical axis is also likely to be displaced.

In order to solve these problems, in recent years, it has been studied to provide a glass layer having a ceramics filler incorporated, as a protective layer for a silver reflection layer. When the protective layer is made of a sintered product of a mixture of a glass powder and a ceramics filler, the fluidity in a non-fired state is lowered, and the flatness becomes high. Further, in a case where the ceramics filler is incorporated in the glass layer, the reflection direction of light entering the glass layer from a light emitting element can be dispersed, whereby fluctuation in light distribution characteristics can also be reduced.

However, as shown in FIG. 5(a), in a case where a glass layer 53 containing an alumina filler 52 containing e.g. $Al_2O_3$ as the main component is provided on the silver reflection layer 51, silver ions migrate (migration) from the silver reflection layer 51 to the glass layer 53 in a firing step. Further, as shown in FIG. 5(b), silver ions migrated are localized on the surface of the alumina filler 52 and a periphery thereof, whereby the silver ion layer 54 at a high concentration is formed. Further, such a phenomenon is likely to occur that a part of the silver ion layer 54 localized on e.g. the surface of the alumina filler 52 is likely to be exposed on the surface of the glass layer 53. Further, as shown in FIG. 5(c), in a case where a light-emitting element is mounted on such a glass layer 53 and sealed with a sealing layer 55 such as a silicone resin, the silver ions ($Ag^+$) at a high concentration, contained in such silver ion layers 54 exposed on the surface of the glass layer 53, are likely to be in contact with e.g. a platinum catalyst contained in a sealing layer 55 and thereby to be reduced to form $Ag^0$, and as shown in FIG. 5(d), they are likely to cohere to be formed into colloidal particles. Further, there has been also a phenomenon of so-called silver coloring, that is, silver particles 56 (colloidal particles) thus cohered are colored at the interface between the glass layer 53 and the sealing layer 55 such as a silicone resin. As a result, reflectance was likely to deteriorate, whereby light intensity (brightness) as a light emitting device was likely to deteriorate.

PRIOR ART DOCUMENT

Patent Document

Patent Document 1: JP-A-2010-34487

DISCLOSURE OF INVENTION

Technical Problem

The present invention has been made to solve the above problems, and it is an object of the present invention to provide a substrate for a light-emitting device, which is provided with a silver reflection layer having a high reflectance and is less susceptible to deterioration of the reflectance due to corrosion and which has an improved light extraction efficiency, and a light-emitting device employing such a substrate.

The substrate for mounting a light-emitting element of the present invention is a substrate for mounting a light-emitting element, which comprises a substrate main body having a mounting surface on which a light-emitting element is to be mounted, a reflection layer composed mainly of silver or a silver alloy, formed on the mounting surface of the substrate main body, and a protective layer, formed so as to cover the entire surface of the reflection layer, wherein the protective layer contains an alumina filler and further contains a glass having silver ions diffused therein.

In the substrate for mounting a light-emitting element of the present invention, the concentration of silver contained in the glass is preferably at least 0.5 mass % and at most 5.0 mass % as calculated as concentration of $Ag_2O$. Further, the content of the alumina filler contained in the protective layer is preferably at least 5 mass % and at most 70 mass %. Further, the content of the alumina filler contained in the protective layer is preferably at least 3 vol % and at most 60 vol %.

Further, in the substrate for mounting a light-emitting element of the present invention, the glass in the protective layer preferably comprises, as its constituting components, at least $SiO_2$, $Al_2O_3$ and CaO. The glass is preferably one obtained by firing a glass powder comprising, as represented by mol % based on oxides, from 40 to 70% of $SiO_2$, from 1 to 20% of $Al_2O_3$, from 5 to 25% of $B_2O_3$, from 5 to 40% of CaO, and from 0 to 8% of at least one member selected from the group consisting of $Li_2O$, $Na_2O$ and $K_2O$.

The process for producing a substrate for mounting a light-emitting element of the present invention is a process for producing the substrate for mounting a light-emitting element of the present invention, which comprises:

a step of preparing a first green sheet for forming the substrate main body, a step of forming a paste layer for the reflection layer for forming the reflection layer, on the surface to be the mounting surface for the first green sheet, a step of forming a layer of a precursor for forming the protective layer so as to cover the entire surface of the paste layer for the reflection layer, and a step of firing a non-sintered substrate for mounting a light-emitting element obtained in the above steps.

In the process for producing a substrate for mounting a light-emitting element of the present invention, the step of forming a layer of a precursor may have a step of printing a glass ceramics paste containing the glass powder and the alumina filler. Further, the step of forming a layer of a precursor may have a step of laminating a second green sheet prepared from a glass ceramics composition containing the glass powder and the alumina filler.

The light-emitting device of the present invention comprises the substrate for mounting a light-emitting element of the present invention and the light-emitting element to be mounted on a mounting portion of the substrate for mounting a light-emitting element. Further, in the light-emitting device of the present invention, a part or all of the surface of the protective layer is preferably sealed with a silicone resin containing a platinum catalyst.

Advantageous Effects of Invention

According to the substrate for mounting a light-emitting element of the present invention, by providing a protective layer containing a glass having silver ions diffused therein so as to cover the entire surface of the silver reflection layer, it is possible to prevent cohesion of silver ions and formation into colloidal particles on the surface of the protective layer and thereby to prevent silver coloring, whereby it is possible to prevent deterioration of reflectance. Further, since an alumina filler is contained in the protective layer, it is possible to obtain a substrate for mounting a light-emitting element having a low heat resistance and improved flatness of a mounting portion of a light-emitting element. Further, it is possible to form the silver reflection layer on the substrate and the protective layer formed on the silver reflection layer by firing them simultaneously, and therefore burden on the step can be suppressed.

In the light-emitting device of the present invention, the above-described substrate for mounting a light-emitting element is used, whereby the reflectance of the reflection layer tends to hardly deteriorate, and it is possible to maintain the luminous efficiency for a long period of time. Further, inclination or damage of the light-emitting element can be suppressed, and therefore it is possible to obtain favorable emission light which is free from fluctuation in light distribution characteristics.

DESCRIPTION OF EMBODIMENTS

Now, the present invention will be described in detail.

Figure 1:
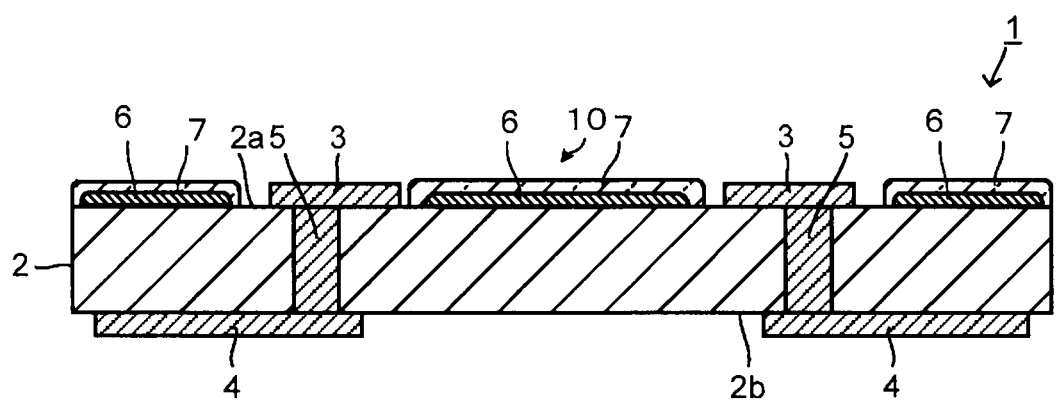
FIG. 1 is a cross-sectional view illustrating an example of the substrate for mounting a light-emitting element of the present invention.

FIG. 1 is a cross-sectional view illustrating an example of the substrate for mounting a light-emitting element of the present invention. A substrate 1 for mounting a light-emitting element has a substantially flat plate-form substrate main body 2. One of the main surfaces of the substrate main body 2 is a mounting surface 2a on which a light-emitting element such as a LED element is to be mounted. On the mounting surface 2a, connection terminals 3 to be electrically connected to the light-emitting element are provided. Further, the other main surface of the substrate main body 2 is a non-mounting surface 2b on which no light-emitting element is to be mounted, and on the non-mounting surface 2b, external electrode terminals 4 to be electrically connected to an external circuit, are provided. Further, in the interior of the substrate main body 2, via conductors 5 for electrically connecting these connection terminals 3 and the external electrode terminals 4, are provided.

On a substantially center portion of the mounting surface 2a of the substrate main body 2, a silver reflection layer (center portion reflection layer) 6 for reflecting light emitted from a light-emitting element, is provided, and on the silver reflection layer 6, a protective layer 7 is provided so as to cover the entire surface (the upper surface and the side surface) on the reflection layer 6. Further, a part of the protective layer 7 constitutes a mounting portion 10 on which a light-emitting element is to be mounted. This protective layer 7 is composed of a material containing a glass and an alumina filler, and further in the glass constituting a protective layer 7, silver ions are contained in such a state that they are diffused therein.

Also on the periphery of the mounting surface 2a of the substrate main body 2, a silver reflection layer (peripheral portion reflection layer) 6 is provided so as to reflect light emitted from the light-emitting element, and also on the silver reflection layer 6, the protective layer 7 is provided so as to cover the entire surface thereof. It is preferred that the protective layer 7 provided on the peripheral portion reflection layer 6 is also composed of a material containing a glass and an alumina filler, and further in the glass, silver ions are contained in such a state that they are diffused therein, in the same manner as the protective layer 7 provided on the center portion reflection layer 6.

By providing such a protective layer 7 so as to cover the entire surface of the silver reflection layer 6, infiltration of gas or liquid to the silver reflection layer 6 can be suppressed and it is thereby possible to prevent oxidation or sulfurization of the silver reflection layer 6, and further it is possible to prevent cohesion of silver ions and formation into colloidal particles on the surface of the protective layer 7 and thereby prevent silver coloring, whereby it is possible to prevent deterioration of the reflectance.

The silver reflection layer 6 is a layer made of e.g. silver, or a silver alloy such as silver/palladium alloy or a silver/platinum alloy. In the case of using a silver alloy, the content of silver is preferably at least 90 mass % from the viewpoint of reflectance. Specifically, in the case of a silver/palladium alloy, palladium may be contained in an amount of up to 10 mass %, and in the case of a silver/platinum alloy, platinum may be contained in an amount of up to 3 mass %. The silver reflection layer 6 is preferably one having a high reflectance, particularly preferably a silver layer. The reflection layer 6 can be formed in such a method that a vehicle such as ethyl cellulose and, as the case requires, a solvent etc. are added to a powder of silver or the above silver alloy, and the resulting paste is printed on the mounting surface 2a of the substrate main body 2 by e.g. screen printing, followed by firing.

The protective layer 7 is a layer to protect the silver reflection layer 6 as an underlayer from corrosion such as oxidation or sulfurization, and is composed of a sintered body containing a glass and an alumina filler (hereinafter referred to as a glass ceramics sintered body). Further, in this specification, "alumina filler" is a ceramics filler containing at least 50 mass % of alumina ($Al_2O_3$) as a chemical component. As a component other than alumina ($Al_2O_3$), silica ($SiO_2$), zirconia ($ZrO_2$), ceria ($CeO_2$), titania ($TiO_2$) or zinc oxide (ZnO) may be mentioned. Further, in the substrate 1 for mounting a light-emitting element of the present invention, silver ions ($Ag^+$) are contained in such a state that the silver ions ($Ag^+$) are diffused without being localized, in a glass constituting the protective layer 7. The silver ion concentration (proportion) contained in the glass is preferably from 0.5 to 5.0 mass % as calculated as concentration of $Ag_2O$. Further, hereinafter, the silver ion concentration is represented as a concentration as calculated as concentration of $Ag_2O$. More preferred silver ion concentration is from 1.0 to 5.0 mass %, particularly preferred silver ion concentration is from 2.0 to 5.0 mass %.

Such a protective layer 7 is formed by employing, as a precursor, a glass paste or a green sheet to form the above glass ceramic sintered product by firing. A method for forming the precursor of the protective layer 7 will be described below.

In a case where a glass paste is employed as a precursor for the protective layer 7, the thickness of the protective layer 7 after firing is preferably from 5 to 30 μm. If the thickness is less than 5 μm, the coating property tends to be inadequate, and accordingly, it is preferably at least 5 μm, more preferably at least 10 μm. If the thickness exceeds 30 μm, the heat dissipating properties of the light-emitting element are likely to be impaired, and the luminous efficiency is likely to deteriorate. It is preferably at most 25 μm.

However, if the thermal conductivity of the protective layer 7 itself is high, the heat dissipating property is not impaired. As a means to improve the thermal conductivity, a large amount of a ceramics filler having higher thermal conductivity than glass may be incorporated in the protective layer. Accordingly, by employing, as the precursor, a green sheet capable of highly dispersing a glass and a ceramics filler, it is possible to incorporate a ceramics filler into the protective layer 7 in an amount larger than the case where a glass paste is used as the precursor.

In the case of using the green sheet as a precursor for the protective layer 7, the thickness of the protective layer 7 after firing is preferably from 10 to 300 μm. If it is less than 10 μm, e.g. cracking tends to occur on the green sheet at the time of laminating the protective layer, whereby the coating property tends to be inadequate. It is more preferably at least 50 μm, and further preferably at least 80 μm. If it exceeds 300 μm, the heat dissipating property of the light-emitting element will be impaired, whereby the emission efficiency tends to deteriorate. It is preferably at most 200 μm, more preferably at most 150 μm.

The average particle size ($D_{50}$) of the alumina filler contained in the protective layer 7 is preferably at least 0.5 μm and at most 4 μm. Here, in this specification, $D_{50}$ is a value obtained by a particle size distribution analyzer of a laser diffraction scattering method.

The content of the alumina filler is preferably at least 5 mass % and at most 70 mass %, by mass %, based on the total amount of materials constituting the protective layer 7. If the content of the alumina filler is less than 5 mass %, e.g. swell tends to occur during firing since the fluidity in a non-fired state is too high at the time of heating the precursor for the protective layer 7, whereby the flatness of the surface of the protective layer 7 tends to deteriorate. Further, silver coloring is likely to occur due to unstable silver ions. That is, in order to stabilize silver ions as ions, counter anions are needed, and four-coordinate aluminum ions eluted from the alumina filler to the glass play a role of the above counter anions. Accordingly, in a case where the content of an alumina filler is less than 5 mass %, silver coloring is likely to occur since silver ions are not sufficiently stabilized in the glass. The content of the alumina filler is preferably at least 10 mass %, more preferably at least 15 mass %.

On the other hand, if the content of the alumina filler exceeds 70 mass %, it is difficult to obtain a sintered product having a uniform composition. It is preferably at most 65 mass %, more preferably at most 60 mass %. Further, the protective layer 7 may contain a ceramics filler other than the alumina filler, such as a silica powder, a titania powder or a zirconia powder, together with the alumina filler such as an alumina powder. In such a case, the content of the ceramics filler other than the alumina filler is preferably at most 25 mass % based on the total amount of the materials constituting the protective layer 7. However, the total content of the alumina filler and the ceramics filler other than the alumina filler is at most 70 mass % based on the total amount of the materials constituting the protective layer 7.

Further, the content of the alumina filler is preferably at least 3 vol % and at most 60 vol %, by vol %, based on the total amount of materials constituting the protective layer 7. If the content of the alumina filler is less than 3 vol %, the fluidity of the protective layer 7 in non-fired state is too high, e.g. swell will occur at the time of firing, whereby the flatness of the surface of the protective layer 7 tends to deteriorate. It is preferably at least 7 vol %, more preferably at least 12 vol %.

On the other hand, if the content of the alumina filler exceeds 60 vol %, it is difficult to obtain a sintered product having a uniform composition. It is preferably at most 55 vol %, more preferably at most 50 vol %. In the case of containing the above ceramics filler other than the alumina filler, it is preferably at most 15 vol %. The total of the content of the alumina filler and the content of the ceramics filler other than the alumina filler is at most 60 vol % based on the total amount of the materials constituting the protective layer 7.

The glass constituting the protective layer 7 is preferably a sintered product obtained by firing a glass powder comprising, as represented by mol % based on oxides, from 40 to 70% of $SiO_2$, from 1 to 20% of $Al_2O_3$, from 5 to 25% of $B_2O_3$, from 5 to 40% of CaO, and from 0 to 8% of at least one member selected from the group consisting of $Li_2O$, $Na_2O$ and $K_2O$.

The present inventor studied a cause for silver coloring, and as a result they found that in a case where silver ions migrated from the silver reflection layer 6 to the glass at the time of firing the glass constituting the protective layer 7 are localized on the surface and in the periphery of the alumina filler, the silver ions are likely to be reduced and likely to be formed into colloidal particles by cohesion, whereby the silver coloring tends to occur. Further, they found that silver ions can be incorporated in such a state that they are diffused without being localized in the periphery of an alumina filler, whereby a glass composition free from silver coloring was found. By employing, as the glass constituting the protective layer 7, a sintered product obtained by firing the glass powder having the above composition, silver ions with the above concentration (from 0.5 to 5.0 mass %) migrated from the silver reflection layer 6 at the time of firing, can be incorporated in such a state that they are diffused in the glass.

Figure 2:
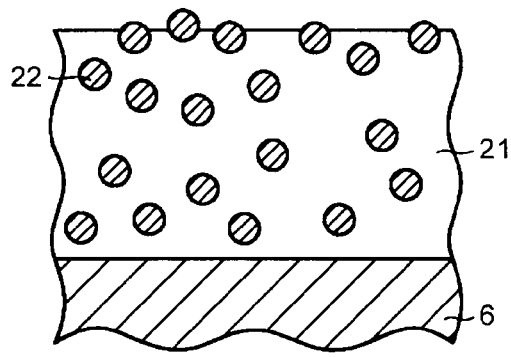
FIG. 2 is enlarged cross-sectional views illustrating a protective layer and its periphery, in the substrate for mounting a light-emitting element of the present invention.
Figure 2:
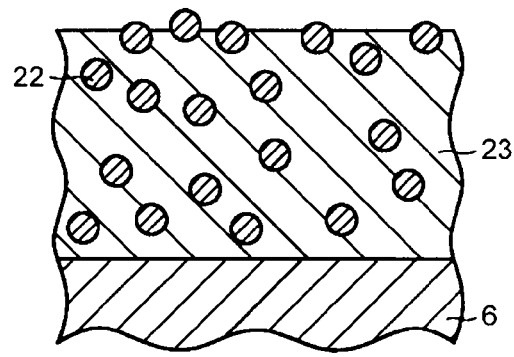
Figure 2:
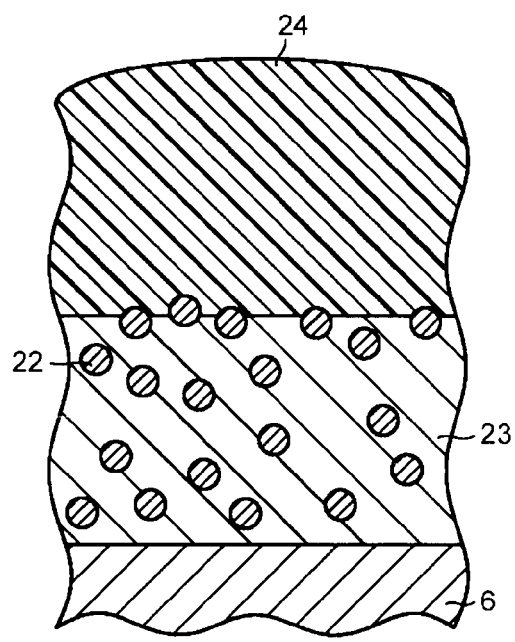

That is, in a case where the glass constituting the protective layer 7 is one obtained by firing a glass powder comprising, as represented by mol % based on oxides, from 40 to 70% of $SiO_2$, from 1 to 20% of $Al_2O_3$, from 5 to 25% of $B_2O_3$, from 5 to 40% of CaO, and from 0 to 8% of at least one member selected from the group consisting of $Li_2O$, $Na_2O$ and $K_2O$, as shown in FIGS. 2(a) to (b), silver ions migrated from the silver reflection layer 6 to the glass layer 21 in the firing step are uniformly contained as diffused in the entire glass layer 23 without being localized on the surface and in the periphery of the alumina filler 22. Accordingly, also in a case where a light-emitting element (not shown) is mounted on such a glass layer 23 having the silver ions diffused/contained and sealed by the sealing layer 24 such as a silicone resin as shown in FIG. 2(c), it is possible to prevent silver coloring since colloidal particles are not formed due to cohesion of the silver ions.

Now, components of a raw material (a glass powder) to obtain a glass constituting the protective layer 7 will be described. In the following, unless otherwise specified, the composition is shown by mol %, which is represented simply by %.

$SiO_2$ is a glass network former, and it is a component to increase chemical durability, particularly acid resistance and thus is essential. If the content (proportion) of $SiO_2$ is less than 40%, the acid resistance is likely to be inadequate. If it exceeds 70%, the melting temperature of the glass tends to be high, or the glass softening point (Ts) tends to be too high.

$Al_2O_3$ is a component to increase the glass stability and chemical durability, and thus is an essential component to suppress coloring at the interface between a protective layer and a silicone resin sealing layer. If the content of $Al_2O_3$ is less than 1%, the suppression of coloring at the interface between the protective layer and the silicone resin sealing layer tends to be inadequate. On the other hand, if the content of $Al_2O_3$ exceeds 20%, the softening point tends to be excessively high. The content of $Al_2O_3$ in a suitable glass composition is preferably at least 1% and at most 20%, more preferably at least 4% and at most 15%.

$B_2O_3$ is an essential component since it is a glass network former and a component to lower the softening point. If the content (proportion) of $B_2O_3$ is less than 5%, the glass melting temperature tends to be high, or the glass tends to be unstable. If it exceeds 25%, it becomes difficult to obtain a stable glass, or the chemical durability may deteriorate.

CaO is a component to increase the glass stability and lower the softening point. If the content of CaO is less than 5%, the glass stability is not likely to be increased adequately, or the softening point is not likely to be lowered sufficiently. On the other hand, if the content of CaO exceeds 40%, the glass stability may rather deteriorate. The content of CaO in a suitable glass composition is preferably at least 5% and at most 40%, more preferably at least 7% and at most 35%.

Further, as a component to increase the glass stability and lower the softening point substantially similarly to CaO, at least one member selected from the group consisting of MgO, BaO and SrO may be contained therein. In such a case, the content of MgO, BaO and SrO and the content of CaO are at most 40% in total. If the total content of CaO, MgO, BaO and SrO exceeds 40%, the glass stability is likely to deteriorate. The total content of CaO, MgO, BaO and SrO in a suitable glass composition is preferably at least 5% and at most 40%. Further, the total content of MgO, BaO and SrO (except for CaO) is preferably at most 10%, more preferably at most 8%.

$Li_2O$, $Na_2O$ and $K_2O$ as alkali metal oxides are not essential components, but may preferably be incorporated therein since they are components to lower the softening point. One or two among $Li_2O$, $Na_2O$ and $K_2O$ may also be contained therein. If the total content thereof exceeds 6%, the chemical durability, particularly the acid resistance tends to deteriorate. Further, the coloring at the interface between the protective layer and the silicone resin sealing layer tends to accelerate. The total content of $Li_2O$, $Na_2O$ and $K_2O$ in a suitable glass composition is preferably at least 0% and at most 8%, more preferably at least 2% and at most 7%.

Further, the raw material for the glass constituting the protective layer 7 is preferably one composed of the above components, but may contain other components within a range not to impair the purpose of the present invention. However, even when such other components are contained therein, the total content thereof is at most 10%, preferably at most 5%.

Among the above glass composition, one having a glass composition of especially 60.4% of $SiO_2$, 15.6% of $B_2O_3$, 3.0% in total of $Na_2O$ and/or $K_2O$, 15.0% of CaO and 6.0% of $Al_2O_3$ as a basis, is suitable as a glass material for the protective layer 7 since it is possible to effectively carry out sintering even when a prescribed amount of an alumina filler is contained therein, and further it is possible to contain silver ions in such a state they are diffused without being localized in the periphery of an alumina filler.

In the substrate 1 for mounting a light-emitting element of the present invention, the substrate main body 2 is a substantially flat plate-form member, but may be a member having a concave (cavity) formed so that a mounting portion of the light-emitting element is located at a position lower by one step. The material constituting the substrate main body 2 is not particularly limited, but one which undergoes no deformation even in the case of applying/firing a paste of the composition composed mainly of glass in the step of forming the above protective layer 7, is preferred, and an inorganic material is preferably used. Among the inorganic materials, an alumina, a low temperature co-fired ceramic (hereinafter referred to as LTCC) or aluminium nitride may, for example, be preferably used from the viewpoint of the thermal conductivity, the heat dissipating property, strength and production costs. Especially, in a case where LTCC is used as the substrate main body 2, the substrate main body 2, outer wirings such as connection terminals 3 or external electrode terminals 4, and internal wirings such as via conductors 5 can be formed by co-firing. Further, since such an LTCC substrate and the above silver reflection layer 6 and protective layer 7 can be formed by co-firing, it is possible to efficiently produce the substrate 1 for mounting a light-emitting element at a low cost.

The substrate main body 2 made of LTCC, and the substrate 1 for mounting a light-emitting element having the substrate main body 2 may, for example, be produced as follows.

First, a green sheet for a substrate main body is formed. The green sheet for a substrate main body can be obtained by adding a binder and, as the case requires, a plasticizer, a solvent, etc. to a glass ceramics composition containing a glass powder for a substrate main body and a ceramics filler to prepare a slurry, and forming it into a sheet-form by e.g. a doctor blade method, followed by drying.

The glass powder for a substrate main body is not necessarily limited, but one having a glass transition point (Tg) of at least 550° C. and at most 700° C. If the glass transition point (Tg) is less than 550° C., the after-mentioned binder burn out is likely to be difficult. On the other hand, if the glass transition point (Tg) exceeds 700° C., the shrinkage start temperature tends to be high so that the dimension accuracy is likely to deteriorate.

As such a glass powder for a substrate main body, preferred is, for example, one comprising at least 57 mol % and at most 65 mol % of $SiO_2$, at least 13 mol % and at most 18 mol % of $B_2O_3$, at least 9 mol % and at most 23 mol % of CaO, at least 3 mol % and at most 8 mol % of $Al_2O_3$, and at least 0.5 mol % and at most 6 mol % in total of at least one member selected from the group consisting of $K_2O$ and $Na_2O$.

The glass powder for a substrate main body can be obtained by producing a glass having the above-described glass composition by a melting method and grinding it by a dry grinding method or a wet grinding method. In the case of a wet grinding method, it is preferred to employ water or an ethyl alcohol as a solvent. The grinding can be carried out by using a grinding machine such as a roll mill, a ball mill or a jet mill. Here, the glass powder for a substrate main body is not necessarily limited to one consisting solely of the above components, but may contain other components within a range satisfying various properties such as a glass transition point. In a case where other components are contained, the total content thereof is preferably at most 10 mol %.

The average particle size ($D_{50}$) of the glass powder for a substrate main body 2 is preferably from 0.5 to 2 μm. If $D_{50}$ of the glass powder for a substrate main body 2 is less than 0.5 μm, the glass powder is likely to cohere, whereby the handling tends to be difficult, and it tends to be difficult to uniformly disperse it. On the other hand, if $D_{50}$ of the glass powder exceeds 2 μm, the glass softening temperature is likely to rise, or the sintering is likely to be inadequate. The particle size can be adjusted, for example by classification which is carried out after the grinding, as the case requires.

As the ceramics filler, one which has been heretofore used for the production of a LTCC substrate, can be employed, and an alumina powder, a zirconia powder or a mixture of an alumina powder and a zirconia powder can suitably be employed. $D_{50}$ of the ceramics filler is preferably from 0.5 to 4 μm for example.

The above glass powder for a substrate main body and the ceramics filler can be blended and mixed, for example, so that the glass powder would be at least 30 mass % and at most 50 mass %, and the ceramics filler would be at least 50 mass % and at most 70 mass %, to obtain a glass ceramics composition.

Further, to this glass ceramics composition, a binder and, as the case requires, a plasticizer, a solvent, etc. are added to obtain a slurry. As the binder, for example, polyvinyl butyral or an acrylic resin may be suitably used. As the plasticizer, for example, dibutyl phthalate, dioctyl phthalate or butyl benzyl phthalate may be employed. Further, as the solvent, an aromatic or alcohol organic solvent such as toluene, xylene or butanol may be employed. Further, a dispersing agent or a leveling agent may also be used.

This slurry is formed into a sheet-form by e.g. a doctor blade method, and dried to produce a green sheet for a substrate main body. The green sheet for substrate main body thus produced can be cut into a prescribed size by using a punch or a punching machine, and at the same time, via holes for interlayer connection can be formed at prescribed positions by punching.

On the surface of the green sheet for a substrate main body, a paste of an electroconductive metal is printed by e.g. screen printing to form a non-fired conductor pattern. Further, such a paste of a conductor metal is filled in the above-mentioned via holes for interlayer connection, to form a non-fired interlayer connection portion. Thus, non-fired connection terminals, non-fired external electrode terminals and non-fired via conductors are formed. Further, as such a metal paste of a conductor metal, one having a vehicle such as ethyl cellulose and, as the case requires, a solvent, etc. added to a conductor metal powder containing e.g. copper, silver or gold as the main component, may be employed.

Further, by printing a paste having a vehicle such as ethyl cellulose and, as the case requires, a solvent, etc. added to a powder of silver or the silver alloy on the prescribed position of the surface of the green sheet for a substrate main body by e.g. a screen printing, a non-fired silver reflection layer is formed, and further a layer (non-fired protective layer) of a precursor to be formed into the protective layer 7 by firing is then formed thereon.

Here, in a case where a glass paste is employed for a precursor for the protective layer 7, a glass paste of a mixture containing the above-mentioned glass powder having a composition for a protective layer (hereinafter referred to as "a glass powder for protective layer") and an alumina filler, is printed by e.g. screen printing to form a glass paste layer, whereby the non-fired protective layer is prepared. Further, a method for forming the glass paste layer is not limited to a printing method so long as it is a method capable of forming the layer having a thickness of from 5 to 30 μm to be flat after the firing.

Further, in a case where a green sheet is employed as a precursor for the protective layer 7, a green sheet (a green sheet for a protective layer) prepared by using a mixture containing a glass powder for a protective layer and an alumina filler, in the same manner as the above green sheet for a substrate main body, is laminated on the non-fired silver reflection layer, and integrated by heating and pressing to form a non-fired protective layer.

Then, a plurality of green sheets for a substrate main body, on which a non-fired conductor pattern, a non-fired silver reflection layer, a non-fired protective layer, etc. are formed, are laminated and integrated by heating and pressing while positioning them, and then kept e.g. at a temperature of at least 500° C. and at most 600° C. for at least 1 hour and at most 10 hours. Thus, the binder such as a resin contained in the green sheet for a substrate main body is decomposed/removed to carry out binder burn out. Thereafter, heating is kept at a temperature of 850 to 900° C. for 20 to 60 minutes, to fire the glass ceramics composition constituting the green sheet for a substrate main body. By the firing, the interior of the glass ceramic substrate, the metal paste formed on the surface, and the non-fired protective layer (glass paste layer or green sheet for a protective layer) are also fired simultaneously to prepare a substrate main body 2 having connection terminals 3, external electrode terminals 4, via conductors 5, silver reflection layers 6 and the protective layers 7.

If the binder burn out temperature is lower than 500° C. or the binder burn out time is less than 1 hour, it is difficult to sufficiently remove e.g. the binder. On the other hand, if the binder burn out temperature exceeds 600° C., there is a possibility that sintering of a glass proceeds, or the binder, etc. may not sufficiently be removed. Further, if the binder burn out hour exceeds 10 hours, the productivity etc. may deteriorate.

If the firing temperature is less than 850° C. or the firing time is less than 20 minutes, one having a dense structure may not be obtainable. On the other hand, if the firing temperature exceeds 900° C., it becomes difficult to keep the shape of e.g. a conductor pattern. Further, if the firing time exceeds 60 minutes, the productivity etc. may deteriorate. It is particularly preferred to carry out firing at a temperature of from 860 to 880° C. In a case where a metal paste containing a metal powder composed mainly of silver is used for forming the silver reflection layer 6, if the firing temperature exceeds 880° C., the metal paste may excessively be softened, and a prescribed shape may not be maintained.

In the foregoing, the substrate 1 for mounting a light-emitting element of the present invention was described, but within the concept of the present invention, and as the case requires, the construction may suitably be changed.

Then, the light-emitting device of the present invention will be described. As shown in e.g. FIG. 3, the light-emitting device of the present invention is such that a light-emitting element 11 such as a LED element is mounted on a mounting portion 10 of the protective layer 7, provided on a mounting surface 2a of the substrate 1 for mounting a light-emitting element of the present invention. The light-emitting element 11 is fixed on the protective layer 7 by using an adhesive, and electrodes which are not shown are electrically connected with connection terminals 3 by bonding wires 12. Further, a sealing layer 13 made of a mold resin is provided so as to cover the light-emitting element 11 and the bonding wires 12 to constitute a light-emitting device 20.

As the mold resin constituting the sealing layer 13, a silicone resin is preferably used from the viewpoint of excellent light fastness and heat resistance. To the mold resin, a catalyst such as platinum or titanium is added, whereby it is possible to quickly cure the mold resin.

By mixing or dispersing e.g. a phosphor in the mold resin for sealing, light obtained from the light-emitting device 20 may suitably be adjusted to a desired emission color. That is, a phosphor is mixed or dispersed in the sealing layer, whereby the phosphor excited by light radiated from the light-emitting element 11 emits visible light, and by color mixing of this visible light and the light radiated from the light-emitting element 11, a desired emission color from the light-emitting device 20 can be obtained. The type of the phosphor is not particularly limited and may suitably be selected depending upon the type of light radiated from the light-emitting element or the desired emission color. Further, as a method of disposing the phosphor, it is possible to provide a layer of a phosphor on e.g. the sealing layer 13, without being limited to a method of mixing or dispersing it in the sealing layer 13 as mentioned above.

According to the light-emitting device 20 of the present invention, a protective layer 7 containing an alumina filler and further containing silver ions as diffused in the glass, is provided so as to cover the entire surface of the silver reflection layer 6. By such a construction, it is possible to prevent oxidation or sulfurization of the silver reflection layer 6, and further it is possible to prevent cohesion of the silver ions and formation into colloidal particles on the surface of the protective layer 7, whereby silver coloring can be prevented. Accordingly, it is possible to obtain the light-emitting device 20 being less susceptible to the loss of light supplied from the light-emitting element 11, and being capable of obtaining sufficient light-emitting brightness.

Further, according to the light-emitting device 20 of the present invention, by employing the substrate 1 for mounting a light-emitting element being excellent in flatness of the mounting portion 10 and having a small heat resistance, an excessive temperature increase of the light-emitting element 11 can be suppressed, whereby light emission with high brightness can be achieved.

Such a light-emitting device 20 of the present invention can suitably be used as a backlight for e.g. mobile phones or large-sized liquid crystal displays, as illumination for automobiles or decorations, or other light sources.

EXAMPLES

Now, the present invention will be described in further detail with reference to Examples.

Examples 1 to 12

Comparative Example

Firstly, a glass ceramics composition for the protective layer was prepared. That is, glass raw materials were blended and mixed so that the respective components of $SiO_2$, $B_2O_3$, $Al_2O_3$, $CaO$, $Na_2O$ and $K_2O$ would be a composition (mol %) shown in Table 1, and this raw material mixture was put into a platinum crucible and melted at a temperature of from 1,500 to 1,600° C. for 60 minutes, and then this molten state glass was cast and cooled. A glass thus obtained was ground by a ball mill made of alumina for from 20 to 60 hours to obtain a glass powder. Here, ethyl alcohol was used as the solvent for grinding.

The average particles size $D_{50}$ (μm) of the glass powder for a protective layer thus obtained was measured by a particle size distribution analyzer of a laser diffraction scattering method (tradename: SALD2100, manufactured by Shimadzu Corporation). The average particle size ($D_{50}$) of the glass powder having each composition, was within a range of from 1 to 3 μm.

Then, to the above glass powder for a protective layer, an alumina powder (tradename: AL-45H, manufactured by Showa Denko K.K.) having $D_{50}$ of 2 μm and a specific surface area of 4.5 $m^2$/g was blended and mixed so that the alumina powder would have a proportion (mass % and vol %) shown in Table 1, to obtain a glass ceramics composition for a protective layer used in each of Examples 1 to 10 and Comparative Example. Further, together with the above alumina powder, a zirconia ($ZrO_2$) powder (tradename: HST-3F, manufactured by Daiichi Kigenso Kagaku Kogyo Co., Ltd.) having $D_{50}$ of 0.5 μm and a specific surface area of 8.0 m²/g was blended and mixed so as to have a proportion (mass % and vol %) shown in Table 1, to obtain a glass ceramics composition for a protective layer to be used in Examples 11 and 12.

Then, in Examples 1 to 9, the above glass ceramics composition for a protective layer and a resin component were blended in a mass ratio of 60:40, followed by kneading for 1 hour in a porcelain mortar, and further by dispersion three times by a three roll mill to prepare a glass paste for a protective layer. Further, as the resin component, one having ethyl cellulose and α-terpineol blended and dispersed in a mass ratio of 85:15, was used.

Further, in Examples 10 to 12, to 50 g of the above glass ceramics composition for a protective layer, 15 g of an organic solvent (a mixture of toluene, xylene, 2-propanol and 2-butanol in a mass ratio of 4:2:2:1), 2.5 g of a plasticizer (di-2-ethylhexyl phthalate), 5 g of polyvinyl butyral (tradename: PVK#3000K, manufactured by Denki Kagaku Kogyo Kabushiki Kaisha) as a binder and 0.5 g of a dispersing agent (tradename: BYK180, manufactured by BYK Japan K.K.) were blended and mixed to prepare a slurry, thereafter this slurry was applied on a PET film by a doctor blade method and dried to produce a green sheet for a protective layer so that a thickness after firing would be a thickness shown in Table 1.

Then, a green sheet for a substrate main body was produced. Firstly, raw materials were blended and mixed so that the $SiO_2$ content would be 60.4 mol %, $B_2O_3$ would be 15.6 mol %, $Al_2O_3$ 6 mol %, CaO 15 mol %, $K_2O$ 1 mol % and $Na_2O$ 2 mol %, and this raw material mixture was put into a platinum crucible and melted at 1,600° C. for 60 minutes. Then this molten state glass was cast and cooled. This glass was ground by a ball mill made of alumina for 40 hours by using ethyl alcohol as a solvent, to produce a glass powder for a substrate main body.

35 mass % of the glass powder for a substrate main body, 40 mass % of an alumina powder (tradename: AL-45H, manufactured by Showa Denko K.K.) and 25 mass % of a zirconia powder (tradename: HSY-3F-J, manufactured by Daiichi Kigenso Kagaku Kogyo Co., Ltd.) were blended and mixed to obtain a glass ceramics composition for a substrate main body. To 50 g of this glass ceramics composition thus obtained, 15 g of an organic solvent (a mixture of toluene, xylene, 2-propanol and 2-butanol in a mass ratio of 4:2:2:1), 2.5 g of a plasticizer (di-2-ethylhexyl phthalate), 5 g of polyvinyl butyral (tradename: PVK#3000K, manufactured by Denki Kagaku Kogyo Kabushiki Kaisha) as a binder and 0.5 g of a dispersing agent (tradename: BYK180, manufactured by BYK Japan K.K.) were blended and mixed to prepare a slurry.

This slurry was applied on a PET film by a doctor blade method and dried to produce a green sheet for a main body so that its thickness would be 0.15 mm after firing.

Further, a silver powder (tradename: S550, manufactured by DAIKEN CHEMICAL CO., LTD.) and ethyl cellulose as a vehicle were blended in a mass ratio of 85:15 and dispersed in α-terpineol as a solvent so that the solid content would be 85 mass %, followed by kneading in a porcelain mortar for 1 hour, and further by dispersion three times by a three roll mill to prepare a silver paste.

On the portions corresponding to a non-fired via conductors of the green sheet for a substrate main body, through-holes having a diameter of 0.3 mm were formed by a punching machine, and filled with the silver paste by a screen printing method to form a non-fired via conductor layer, and non-fired connection terminals and non-fired external electrode terminals.

Green sheets were laminated and integrated by hot pressing, and at the center portion of the mounting surface, a silver paste for a reflection layer was printed and formed by a screen printing method. In Examples 1 to 9 and Comparative Example, the above glass paste for a protective layer was applied thereon by a screen printing method to form a substrate for mounting a non-fired light-emitting element. Further, in Examples 10 to 12, on a silver paste for a reflection layer, the above green sheets for a protective layer were laminated and pressed to form a substrate for mounting a non-fired light-emitting element. The silver paste for a reflection layer was obtained in such a manner that a silver powder (tradename: S400-2, manufactured by DAIKEN CHEMICAL CO., LTD.) and ethyl cellulose as a vehicle were blended in a mass ratio of 85:15 and dispersed in α-terpineol as a solvent so that the solid content would be 85 mass %, followed by kneading in a porcelain mortar for 1 hour, and further by dispersion three times by a three roll mill.

Then, the substrate for mounting a non-fired light-emitting element obtained was kept at 550° C. for 5 hours to decompose/remove a resin component, and then kept at 870° C. for 30 minutes to carry out firing, whereby a substrate for mounting a light-emitting element was produced. The thickness of a silver reflection layer formed on the substrate main body was 20 μm, and the thickness of the protective layer was shown in Table 1.

In such a state, the concentration (content) of silver ions ($Ag^+$) contained in the protective layer was measured. That is, the Ag concentration contained in the entire protective layer was measured by fluorescent X-ray. Further, the concentration of Ag in the glass constituting the protective layer was measured by means of Electron Probe Micro Analyzer (EPMA). Here, an area "in the glass" means an area composed of only a glass excluding an alumina powder. Such an area becomes an area to be detected by EPMA. The measurement result is shown in Table 1 as a value calculated as $Ag_2O$. In the substrate for mounting a light-emitting element in Examples 1 to 12, silver was found to be contained as diffused in a constant proportion in the glass constituting the protective layer.

Figure 3:
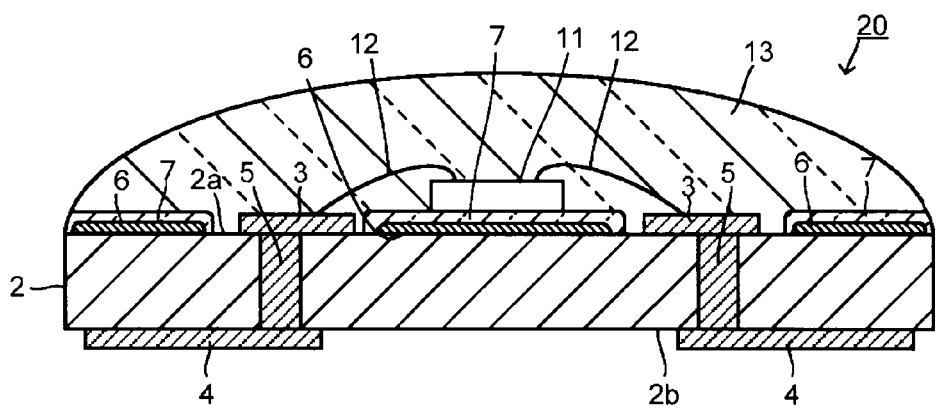
FIG. 3 is a cross-sectional view illustrating an example of the light-emitting device of the present invention.

Then, on the substrate for mounting a light-emitting element obtained in each of Examples 1 to 12 and Comparative Example, a light-emitting diode (LED) element was mounted to prepare a light-emitting device shown in FIG. 3. That is, on a mounting portion of the protective layer, one LED element (tradename: GQ2CR460Z, manufactured by Showa Denko K.K.) was fixed by die bonding material (tradename: KER-3000-M2, manufactured by Shin-Etsu Chemical Co., Ltd.), and the electrodes were electrically connected to connection terminals by bonding wires. Further, by employing a sealing agent, a mold sealing layer was formed. Further, as the sealing agent, a silicone resin for sealing (tradename: SCR-1016A, manufactured by Shin-Etsu Chemical Co., Ltd.) was employed.

Then, in the light-emitting device prepared in each of Examples 1 to 12 and Comparative Example, 35 mA of electric current was applied by a DC voltage/current generator (tradename: R6243, manufactured by ADVANTEST CORPORATION) to emit light from the LED element. Further, the total luminous flux (lumen) of light obtainable from the light-emitting device was measured at the initiation (after 0 hours) of light emitting, at the time when the light-emitting device was left to stand for 100 hours in an environment at a temperature of 80° C. under a humidity of 80%, and at the time when the light-emitting device was left to stand for 250 hours in the same environment as the above, respectively. The total luminous flux was measured by providing the light-emitting device in an integrating sphere (diameter of 6 inches), by a total luminous flux-measuring device (tradename: SOLIDLAMBDA•CCD•LED•MONITOR•PLUS, manufactured by Spectra Co-op). The measurement results are shown in Table 1 and FIG. 4.

Figure 4:
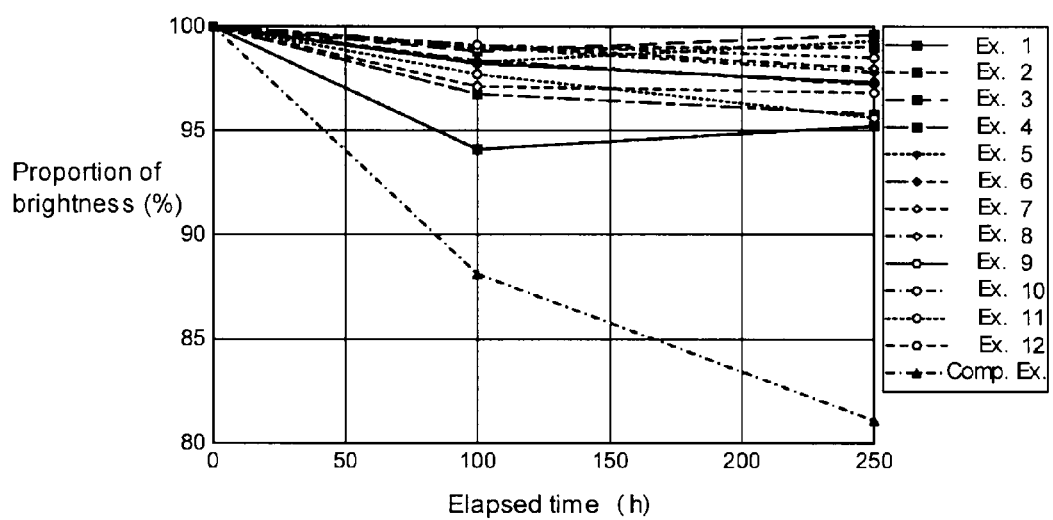
FIG. 4 is a graph illustrating a change in brightness with time, in the light-emitting device in each of Examples of the present invention and Comparative Example.
Figure 5:
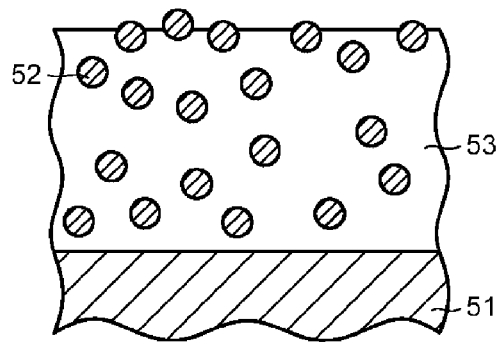
FIG. 5 is cross-sectional views schematically illustrating migration of silver ions to a protective layer and a cohesion state, in a conventional substrate for mounting a light-emitting element.
Figure 5:
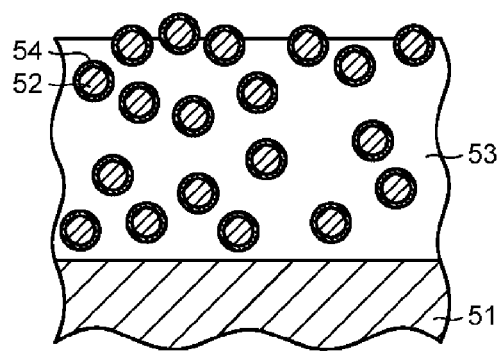
Figure 5:
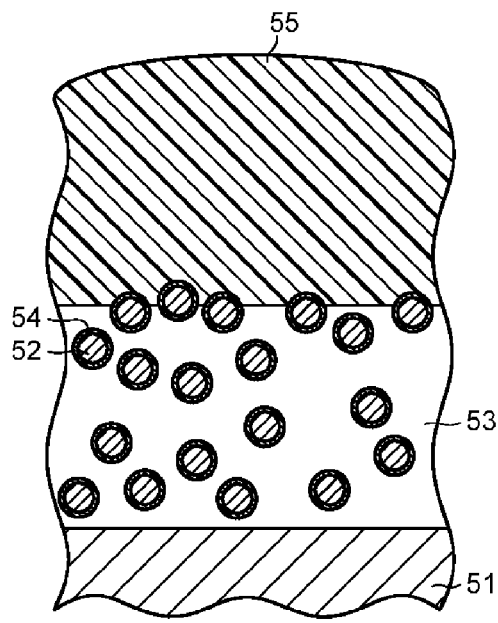
Figure 5:
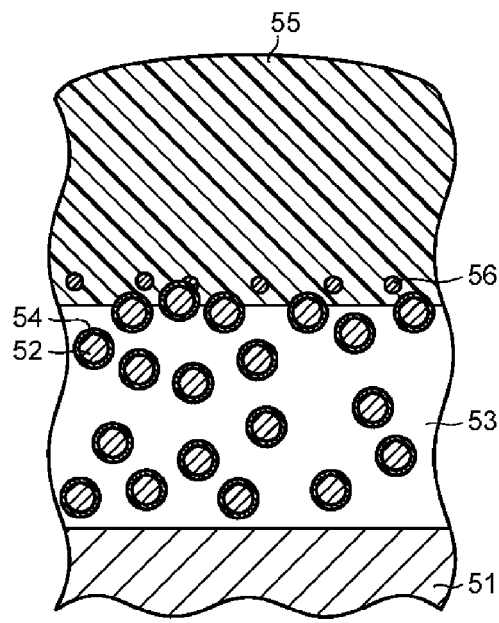

Here, in Table 1 and FIG. 4, the measurement value of the luminous flux in the initiation (after 0 hours) of light-emitting in each of Examples 1 to 12 and Comparative Example was regarded to be 100, and each of measurement values of the luminous flux after 100 hours and after 250 hours was represented as a relative value (proportion of brightness) based on the above respective measurement values.

cation No. 2011-128603 filed on Jun. 8, 2011 and Japanese Patent Application No. 2011-156025 filed on Jul. 14, 2011 including specifications, claims, drawings and summaries are incorporated herein by reference in their entireties.

MEANING OF SYMBOLS

1: Substrate for mounting light-emitting element, 2: Substrate main body, 3: Connection terminal, 4: External electrode terminal, 5: Via conductor, 6: Silver reflection layer, 7: Protective layer, 10: Mounting portion, 11: Light-emitting element, 12: Bonding wire, 13: Sealing layer, 20: Light-emitting device, 21: Glass layer, 22: Alumina filler, 23: Glass layer having silver ions diffused/contained therein.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Comp. Ex. |
|---|---|---|---|---|---|---|---|---|---|---|---|---|---|---|
| Precursor for protective layer | | Paste | Paste | Paste | Paste | Paste | Paste | Paste | Paste | Paste | Sheet | Sheet | Sheet | Paste |
| Thickness of protective layer (μm) | | 20 | 20 | 20 | 20 | 20 | 20 | 20 | 20 | 20 | 140 | 40 | 140 | 20 |
| Alumina powder (mass %) | | 22 | 22 | 22 | 22 | 22 | 22 | 40 | 51 | 61 | 51 | 38 | 28 | 22 |
| $ZrO_2$ powder (mass %) | | | | | | | | | | | | 24 | 24 | |
| Alumina powder (vol %) | | 15 | 15 | 15 | 15 | 15 | 15 | 30 | 40 | 50 | 40 | 33 | 33 | 15 |
| $ZrO_2$ powder (vol %) | | | | | | | | | | | | 14 | 14 | |
| Glass composition (mol %) | $SiO_2$ | 60.4 | 46.0 | 41.7 | 58.6 | 47.5 | 60.4 | 60.4 | 60.4 | 60.4 | 60.4 | 60.4 | 60.4 | 81.6 |
| | $B_2O_3$ | 15.6 | 20.7 | 15.6 | 12.1 | 13.1 | 15.6 | 15.6 | 15.6 | 15.6 | 15.6 | 15.6 | 15.6 | 16.6 |
| | $Al_2O_3$ | 6.0 | 13.5 | 6.0 | 4.6 | 10.9 | 6.0 | 6.0 | 6.0 | 6.0 | 6.0 | 6.0 | 6.0 | 0.0 |
| | CaO | 7.5 | 16.5 | 33.7 | 20.6 | 22.2 | 15.0 | 15.0 | 15.0 | 15.0 | 15.0 | 15.0 | 15.0 | 0.0 |
| | SrO | 7.5 | 0.0 | 0.0 | 0.0 | 0.0 | 0.0 | 0.0 | 0.0 | 0.0 | 0.0 | 0.0 | 0.0 | 0.0 |
| | $Na_2O$ | 2.0 | 2.2 | 2.0 | 3.1 | 5.3 | 2.0 | 2.0 | 2.0 | 2.0 | 2.0 | 2.0 | 2.0 | 0.0 |
| | $K_2O$ | 1.0 | 1.1 | 1.0 | 1.0 | 1.0 | 1.0 | 1.0 | 1.0 | 1.0 | 1.0 | 1.0 | 1.0 | 1.8 |
| | Total | 100.0 | 100.0 | 100.0 | 100.0 | 100.0 | 100.0 | 100.0 | 100.0 | 100.0 | 100.0 | 100.0 | 100.0 | 100.0 |
| Silver content (mass %) | Entire protective layer | 3.0 | 4.6 | 3.4 | 3.6 | 3.8 | 5.0 | 4.0 | 4.1 | 4.5 | 3.0 | 2.2 | 3.5 | 4.3 |
| | In a glass | 2.3 | 4.4 | 1.4 | 2.2 | 2.8 | 2.2 | 2.3 | 1.5 | 3.2 | 1.6 | 2.3 | 2.6 | 0.1 |
| Brightness (%) | Initiation (after 0 hrs) | 100 | 100 | 100 | 100 | 100 | 100 | 100 | 100 | 100 | 100 | 100 | 100 | 100 |
| | After 100 hrs | 94.1 | 98.9 | 98.8 | 96.8 | 98.3 | 98.3 | 99.1 | 99.0 | 98.2 | 99.1 | 97.7 | 97.1 | 88.1 |
| | After 250 hrs | 95.2 | 99.0 | 99.6 | 95.8 | 99.3 | 97.2 | 98.0 | 97.8 | 97.3 | 98.5 | 95.6 | 96.8 | 81.1 |

As is clear from Table 1, in the substrate for mounting a light-emitting element in each of Examples 1 to 12, a protective layer is constituted by a sintered product obtained by firing a mixture of an alumina powder and a glass powder having a specific glass composition. Further, in the glass constituting the protective layer, silver ions are diffused, and further contained in a prescribed concentration (from 0.5 to 5.0 mass %). It was found that in the light-emitting device employing such a substrate for mounting a light-emitting element, no silver coloring occurs at the interface between the protective layer and a silicone resin sealing layer, and deterioration of brightness (total luminous flux) with time hardly occurs. On the other hand, it was found that in the light-emitting device employing the substrate for mounting a light-emitting element in Comparative Example, silver ions migrated from the silver reflection layer as an underlayer to the protective layer were not contained in such a state that they were diffused in the glass constituting the protective layer, but localized at a high concentration only in the vicinity of the surface of the alumina powder, whereby in the light-emitting device employing such a substrate for mounting a light-emitting element, brightness was significantly deteriorated due to silver coloring at the interface between the protective layer and the silicone resin sealing layer.

The entire disclosures of Japanese Patent Application No. 2010-166968 filed on Jul. 26, 2010, Japanese Patent Appli-

What is claimed is:

1. A substrate for mounting a light-emitting element, which comprises:
    a substrate main body having a mounting surface on which the light-emitting element is to be mounted,
    a reflection layer composed mainly of silver or a silver alloy, formed on the mounting surface of the substrate main body, and
    a protective layer, formed so as to cover an entire surface of the reflection layer,
    wherein the protective layer comprises: an alumina filler and a glass which comprises silver ions diffused therein, and
    wherein the glass is obtained by firing a glass powder comprising, as represented by mol % based on oxides, from 40 to 70% of $SiO_2$, from 1 to 20% of $Al_2O_3$, from 5 to 25% of $B_2O_3$, from 7 to 40% of CaO, and from 0 to 8% of at least one member selected from the group consisting of $Li_2O$, $Na_2O$ and $K_2O$.

2. The substrate for mounting a light-emitting element according to claim 1, wherein a concentration of silver ions contained in the glass, measured as a mass % of $Ag_2O$ in the glass, is at least 0.5 mass % and at most 5.0 mass %.

3. A process for producing the substrate for mounting a light-emitting element as defined in claim 1, which comprises:

a step of preparing a first green sheet for forming the substrate main body, a step of forming a paste layer for the reflection layer for forming the reflection layer, on the surface to be the mounting surface for the first green sheet, a step of forming a layer of a precursor for forming the protective layer so as to cover the entire surface of the paste layer for the reflection layer, and a step of firing a non-sintered substrate for mounting a light-emitting element obtained in the above steps.

4. The process for producing a substrate for mounting a light-emitting element according to claim 3, wherein the step of forming a layer of a precursor has a step of printing a glass ceramics paste containing the glass powder and the alumina filler.

5. A light-emitting device comprising:

the substrate for mounting a light-emitting element as defined in claim 1, and the light-emitting element to be mounted on a mounting portion of the substrate for mounting a light-emitting element.

6. The light-emitting device according to claim 5, wherein a part or all of the surface of the protective layer is sealed with a silicone resin containing a platinum catalyst.

7. The substrate for mounting a light-emitting element according to claim 1, wherein the glass powder comprises, as represented by mol % based on oxides, from 4 to 15% of $Al_2O_3$.

8. The substrate for mounting a light-emitting element according to claim 1, wherein the glass powder comprises, as represented by mol % based on oxides, from 7 to 35% of CaO.

9. The substrate for mounting a light-emitting element according to claim 1, wherein a concentration of silver ions in the glass, measured as a mass % of $Ag_2O$ in the glass, is at least 1.0 mass % and at most 5.0 mass %.

10. The substrate for mounting a light-emitting element according to claim 1, wherein a concentration of silver ions in the glass, measured as a mass % of $Ag_2O$ in the glass, is at least 2.0 mass % and at most 5.0 mass %.

* * * * *